United States Patent
Geng et al.

(10) Patent No.: US 9,036,679 B2
(45) Date of Patent: May 19, 2015

(54) APPARATUS AND METHOD FOR GENERATING GAUSSIAN PULSE AND ULTRA WIDEBAND COMMUNICATION APPARATUS FOR GENERATING GAUSSIAN PULSE

(71) Applicants: Samsung Electronics Co., Ltd., Suwon-si (KR); Tsinghua University, Beijing (CN)

(72) Inventors: Shuli Geng, Beijing (CN); Woogeun Rhee, Beijing (CN); Jong Jin Kim, Hwaseong-si (KR); Dong Wook Kim, Seoul (KR); Zhihua Wang, Beijing (CN)

(73) Assignees: Samsung Electronics Co., Ltd., Suwon-si (KR); Tsinghua University, Beijing (CN)

( * ) Notice: Subject to any disclaimer, the term of this patent is extended or adjusted under 35 U.S.C. 154(b) by 0 days.

(21) Appl. No.: 13/966,644

(22) Filed: Aug. 14, 2013

(65) Prior Publication Data

US 2014/0050250 A1    Feb. 20, 2014

(30) Foreign Application Priority Data

Aug. 14, 2012   (KR) .................. 10-2012-0089080

(51) Int. Cl.
| | |
|---|---|
| H04B 1/00 | (2006.01) |
| H04L 27/04 | (2006.01) |
| H03K 5/159 | (2006.01) |
| H04B 1/717 | (2011.01) |
| H04L 25/03 | (2006.01) |

(52) U.S. Cl.
CPC ............... H04L 27/04 (2013.01); H03K 5/159 (2013.01); H04B 1/7174 (2013.01); H04L 25/03834 (2013.01)

(58) Field of Classification Search
CPC .................................. H04B 1/707; H04B 1/69
USPC .................. 375/130, 295, 296; 327/106, 277; 341/144, 147
See application file for complete search history.

(56) References Cited

U.S. PATENT DOCUMENTS

| | | | | |
|---|---|---|---|---|
| 4,521,115 | A | * | 6/1985 | Higginbotham et al. ..... 356/432 |
| 7,545,304 | B1 | | 6/2009 | Wu et al. |
| 7,822,161 | B2 | | 10/2010 | Lee et al. |

(Continued)

FOREIGN PATENT DOCUMENTS

| | | |
|---|---|---|
| JP | 2007-35898 A | 2/2007 |
| KR | 10-2004-0040237 A | 5/2004 |

(Continued)

OTHER PUBLICATIONS

Extended European Search Report issued on Nov. 19, 2013, in counterpart European Application No. 13180195.3 (7 pages, in English).

(Continued)

*Primary Examiner* — Khai Tran
(74) *Attorney, Agent, or Firm* — NSIP Law

(57) ABSTRACT

A pulse generation apparatus includes a delay pulse generator configured to generate a plurality of delay pulses, an amplitude modulator configured to modulate amplitudes of the plurality of delay pulses, and a Gaussian pulse generator configured to generate a Gaussian pulse based on the amplitude-modulated delay pulses.

28 Claims, 9 Drawing Sheets

(56) References Cited

U.S. PATENT DOCUMENTS

| | | |
|---|---|---|
| 2002/0080889 A1 | 6/2002 | Dress, Jr. et al. |
| 2002/0101935 A1 | 8/2002 | Wright et al. |
| 2006/0039447 A1 | 2/2006 | Sahinoglu et al. |
| 2007/0153877 A1 | 7/2007 | Siwiak |
| 2008/0205486 A1 | 8/2008 | Badets et al. |
| 2009/0232191 A1 | 9/2009 | Gupta et al. |
| 2011/0188545 A1 | 8/2011 | An |

FOREIGN PATENT DOCUMENTS

| | | |
|---|---|---|
| KR | 10-2005-0052852 A | 6/2005 |
| KR | 10-0656339 B1 | 12/2006 |
| KR | 10-0817629 B1 | 3/2008 |
| KR | 10-0998475 B1 | 12/2010 |
| WO | WO 2012/038732 A1 | 3/2012 |

OTHER PUBLICATIONS

International Search Report issued on Nov. 26, 2013, in counterpart International Application No. PCT/KR2013/007337 (4 pages, in English).

D. Lachartre et al., "A 1.1nJ/b 802.154a-Complaint Fully Integrated UWB Transceiver in 0.13μm CMOS," 2009 *IEEE International Solid-State Circuits Conference—Digest of Technical Papers*, ISSCC 2009, Feb. 2009, pp. 312-313, 313a; conference held Feb. 8-12, 2009, San Francisco; paper presented on Feb. 10, 2009; ISBN 978-1-4244-3458-9; digital object identifier http://dx.doi.org/10.1109/ISSCC.2009.4977433.

* cited by examiner

APPARATUS AND METHOD FOR GENERATING GAUSSIAN PULSE AND ULTRA WIDEBAND COMMUNICATION APPARATUS FOR GENERATING GAUSSIAN PULSE

CROSS-REFERENCE TO RELATED APPLICATIONS

This application claims the benefit under 35 USC 119(a) of Korean Patent Application No. 10-2012-0089080 filed on Aug. 14, 2012, in the Korean Intellectual Property Office, the entire disclosure of which is incorporated herein by reference for all purposes.

BACKGROUND

1. Field

The following description relates to an apparatus and method for generating a Gaussian by controlling a pulse duration and an amplitude of a digital pulse.

2. Description of Related Art

An ultra wideband (UWB) communication technology is a wireless communication technology that uses a high-frequency band of about 3 GHz to about 10 GHz. The UWB communication technology uses a wide bandwidth, and transmits data using an ultrahigh frequency (UHF).

A UWB communication apparatus transmits an impulse having extremely short duration spread over a frequency bandwidth of about 500 MHz, therefore consuming a very small amount of power. Owing to the low power consumption characteristics, the UWB communication apparatus may be conveniently used to implement intelligent home network products, industrial and military products, and a near field communication (NFC) device such as a hearing aid.

For example, the UWB communication apparatus may generate a pulse envelope having a Gaussian pulse shape according to Federal Communications Commission (FCC) spectral mask requirements.

SUMMARY

In one general aspect, a pulse generation apparatus includes a pulse generator configured to generate a plurality of delay pulses; an amplitude modulator configured to modulate amplitudes of the plurality of delay pulses; and a Gaussian pulse generator configured to generate a Gaussian pulse based on the amplitude-modulated delay pulses.

The amplitude modulator may be further configured to modulate the amplitudes of the plurality of delay pulses with different degrees of amplification, or attenuation, or both amplification and attenuation.

The amplitude modulator may be further configured to modulate the amplitudes of the plurality of delay pulses based on current amounts of the plurality of delay pulses in a digital domain.

The Gaussian pulse generator may be further configured to combine the amplitude-modulated delay pulses to generate the Gaussian pulse.

The Gaussian pulse generator may include a single digital power amplifier configured to combine the amplitude-modulated delay pulses to generate the Gaussian pulse.

The delay pulse generator may be further configured to control a center frequency by controlling a duration of the plurality of delay pulses.

The delay pulse generator may include a delay-locked loop configured to control the center frequency.

The delay pulse generator may be further configured to control a center frequency by controlling a number of the plurality of delay pulses.

The Gaussian pulse generator may be further configured to generate an impulse radio-UWB (IR-UWB) signal based on the Gaussian pulse.

In another general aspect, an ultra wideband (UWB) communication apparatus includes a delay pulse generator configured to generate a plurality of delay pulses; an amplitude modulator configured to modulate amplitudes of the plurality of delay pulses; and a Gaussian pulse generator configured to generate a Gaussian pulse corresponding to a partial frequency band of a UWB communication frequency band based on the amplitude-modulated delay pulses.

The Gaussian pulse generator may be further configured to combine the amplitude-modulated delay pulses to generate the Gaussian pulse.

The partial frequency band may include a frequency band defined by an impulse radio-UWB (IR-UWB) spectral mask.

The amplitude modulator may be further configured to modulate the amplitudes of the plurality of delay pulses with different degrees of amplification, or attenuation, or both amplification and attenuation.

The delay pulse generator may be further configured to control a center frequency by controlling a duration of the plurality of delay pulses.

In another general aspect, a pulse generation method includes generating a plurality of delay pulses; modulating amplitudes of the plurality of delay pulses; and generating a Gaussian pulse based on the amplitude-modulated delay pulses.

The modulating may include modulating the amplitudes of the plurality of delay pulses with different degrees of amplification, or attenuation, or both amplification and attenuation.

The modulating may include modulating the amplitudes of the plurality of delay pulses based on current amounts of the plurality of the delay pulses in a digital domain.

The generating of the Gaussian pulse may include combining the amplitude-modulated delay pulses to generate the Gaussian pulse.

The combining of the amplitude-modulated delay pulses may include combining the amplitude modulated pulses using a single digital power amplifier to generate the Gaussian pulse.

The generating of the plurality of delay pulses may include controlling a center frequency by controlling a duration of the plurality of delay pulses.

The generating of the plurality of delay pulses may include controlling the center frequency using a delay-locked loop (DLL).

The generating of the plurality of delay pulses may include controlling a center frequency by controlling a number of the plurality of delay pulses.

The generating of the Gaussian pulse may include generating an impulse radio-UWB (IR-UWB) signal based on the Gaussian pulse.

In another general aspect, a Gaussian pulse generation method includes generating a plurality of amplitude-modulated pulses; and generating a Gaussian pulse based on the plurality of amplitude-modulated pulses.

The generating of the plurality of amplitude-modulated pulses may include generating the plurality of amplitude-modulated pulses based on duration information for controlling a duration of the plurality of amplitude-modulated pulses.

The generating of the plurality of amplitude-modulated pulses may include generating the plurality of amplitude-modulated pulses based on amplitude information providing different degrees of amplification for the plurality of amplitude-modulated pulses according to a Gaussian pulse shape.

The generating of the plurality of amplitude-modulated pulses may include generating the plurality of amplitude-modulated pulses based on amplitude information providing different degrees of amplification for the plurality of amplitude-modulated pulses that will cause a pulse generated by combining the plurality of amplitude-modulated pulses to have a Gaussian pulse shape; and the generating of the Gaussian pulse may include combining the plurality of amplitude-modulated pulses having the different degrees of amplification to generate the Gaussian pulse.

The generating of the plurality of amplitude-modulated pulses may include delaying the plurality of amplitude-modulated pulses relative to one another so that the plurality of amplitude-modulated pulses will adjoin one another without overlapping one another in a pulse generated by combining the plurality of amplitude-modulated pulses; and the generating of the Gaussian pulse may include combining the plurality of amplitude-modulated pulses to generate the Gaussian pulse.

The generating of the Gaussian pulse may include combining the plurality of amplitude-modulated pulses using a single digital power amplifier to generate the Gaussian pulse.

Other features and aspects will be apparent from the following detailed description, the drawings, and the claims.

DETAILED DESCRIPTION

Figure 1:
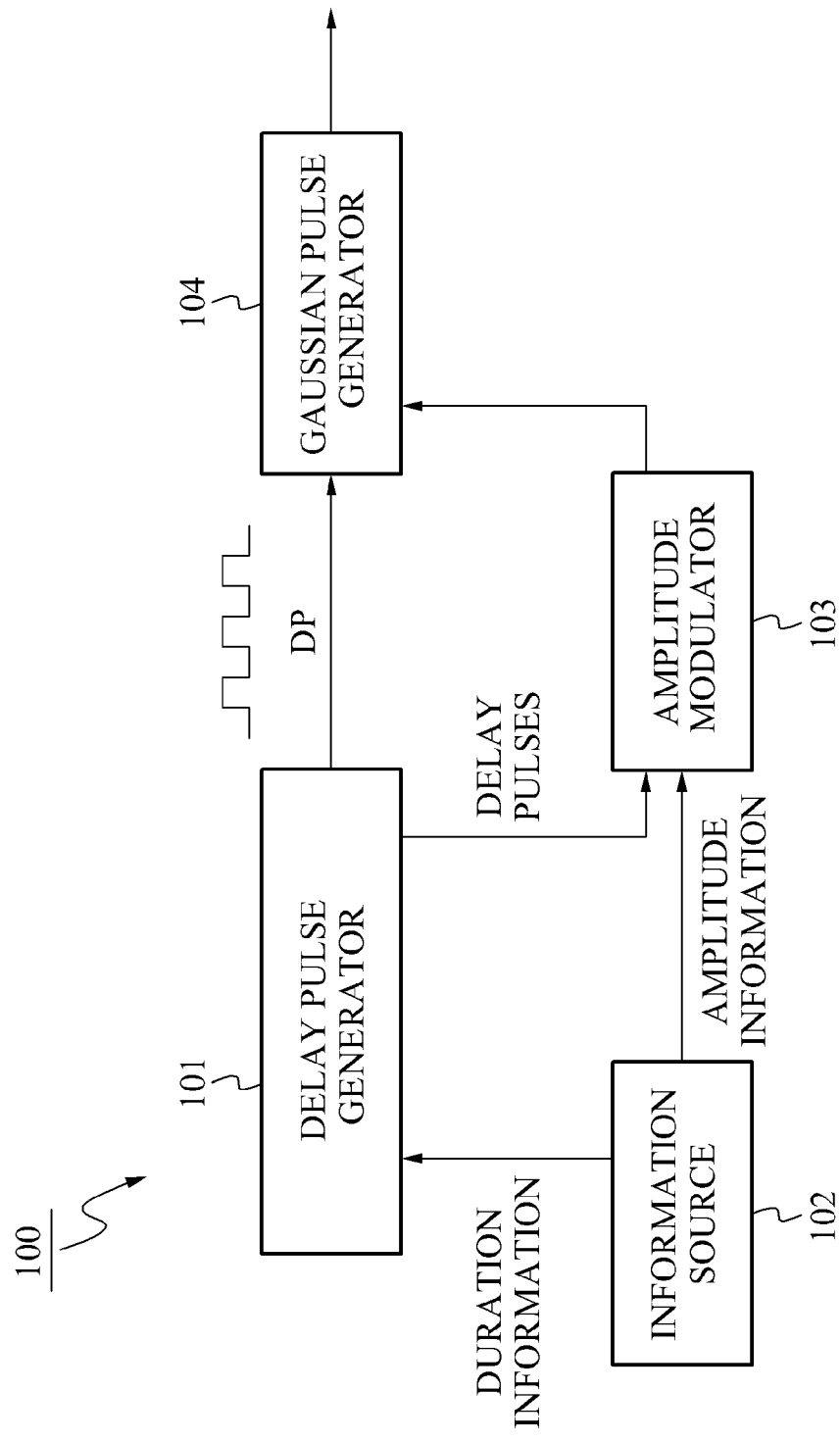
FIG. 1 is a block diagram illustrating an example of a detailed configuration of an example of a Gaussian pulse generation apparatus.

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known in the art may be omitted for increased clarity and conciseness. Any operation processing method described herein may be performed by an operation processing apparatus.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 is a block diagram illustrating an example of a detailed configuration of an example of a Gaussian pulse generation apparatus 100. Referring to FIG. 1, the Gaussian pulse generation apparatus 100 includes a delay pulse generator 101, an information source 102, an amplitude modulator 103, and a Gaussian pulse generator 104.

The delay pulse generator 101 generates a plurality of delay pulses by delaying a digital pulse (DP).

Additionally, the delay pulse generator 101 may control a center frequency by controlling a duration of the plurality of the delay pulses. The delay pulse generator 101 may control the duration of the delay pulses based on duration information input from the information source 102.

For example, the delay pulse generator 101 may control the duration of the delay pulses based on the duration information to be greater than a duration of the DP, or less than or equal to the duration of the DP.

The delay pulse generator 101 may control a number of delay pulses included in the Gaussian pulse by controlling the duration of the plurality of delay pulses. For example, the number of the delay pulses may be decreased as the duration of the delay pulses is increased, and may be increased as the duration of the delay pulses is decreased. That is, the delay pulse generator 101 may control the center frequency by controlling the number of the delay pulses.

Since the center frequency is controlled by controlling the duration of the delay pulses, the Gaussian pulse generation apparatus may provide a plurality of users with different channels having different center frequencies.

The amplitude modulator 103 modulates an amplitude of the plurality of delay pulses in a digital domain. In greater detail, the amplitude modulator 103 may modulate the amplitude based on amplitude information input from the information source 102.

The amplitude information may include amplitude values respectively corresponding to the plurality of delay pulses so that a Gaussian pulse shape may implemented by a combination of the plurality of delay pulses. Therefore, the amplitude modulator 103 may modulate amplitudes of the plurality of delay pulses based on the amplitude values corresponding to current amounts of the plurality of delay pulses.

For example, when five delay pulses are used, and amplitude information of a delay pulse 0 is 1, amplitude information of a delay pulse 1 is 3, amplitude information of a delay pulse 2 is 5, amplitude information of a delay pulse 3 is 3, and amplitude information of a delay pulse 4 is 1, the amplitude modulator 103 amplifies the amplitudes of the delay pulses 0 and 4 by 1, amplifies the amplitudes of the delay pulses 1 and 3 by 3, and amplifies the amplitude of the delay pulse 2 by 5. Thus, the amplitude modulator 103 modulates the amplitudes of the delay pulses with different degrees of amplification so that a Gaussian pulse may be generated by combining the amplitude-modulated delay pulses. The amplitude information of the delay pulses provides different degrees of amplification for the delay pulses according to a Gaussian pulse shape that will result in a pulse generated by combining the amplitude-modulated delay pulses having a Gaussian pulse shape.

In this example, the amplitude modulator 103 amplifies the amplitudes of the delay pulses based on the amplitude information, including amplifying the amplitude of a delay pulse by 1, which does not change the amplitude. However, this is just an example, and the amplitude modulator 103 may attenuate the amplitudes of the delay pulses based on the amplitude information, including attenuating the amplitude of a delay pulse by 1, which does not change the amplitude, or may amplify the amplitudes of one or more of the delay pulses and attenuate the amplitudes of one or more of the delay pulses.

Next, the Gaussian pulse generator 104 generates the Gaussian pulse based on the DP input from the delay pulse generator 101 and the amplitude-modulated delay pulses input from the amplitude modulator 103. The Gaussian pulse generator 104 may generate the Gaussian pulse by synchronizing the amplitude-modulated delay pulses with the DP, and then combining the amplitude-modulated delay pulses.

Thus, the Gaussian pulse generation apparatus 100 may generate the Gaussian pulse using only a single digital power amplifier (DPA) by modulating the amplitude of the plurality of delay pulses with the amplitude modulator 103.

That is, the Gaussian pulse generation apparatus 100 may modulate the amplitudes of the plurality of delay pulses without using separate DPAs having different amplifications to amplify respective ones of the delay pulses. Accordingly, the Gaussian pulse generation apparatus 100 may generate the Gaussian pulse by combining the amplitude-modulated delay pulses using a single DPA.

Figure 2:
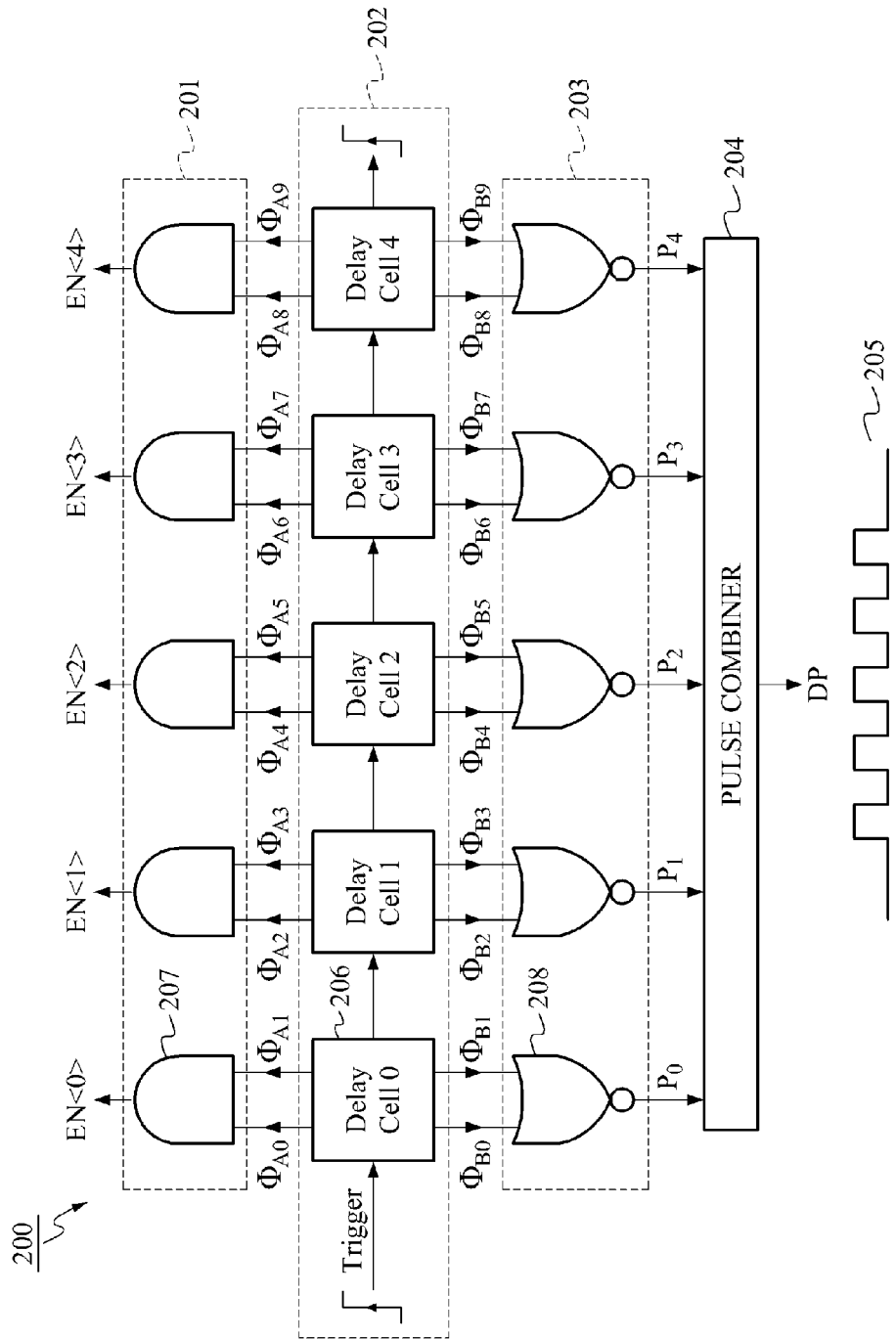
FIG. 2 is a circuit diagram illustrating an example of a delay pulse generator corresponding to a delay pulse generator in the Gaussian pulse generation apparatus of FIG. 1.

FIG. 2 is a circuit diagram illustrating an example of a delay pulse generator 200 corresponding to the delay pulse generator 101 in the Gaussian pulse generation apparatus of FIG. 1. Referring to FIG. 2, the delay pulse generator 200 includes a plurality of AND gates 201, a plurality of delay cells 202, a plurality of NOR gates 203, and a pulse combiner 204.

The plurality of delay cells 202 output information for generating a plurality of delay pulses based on a trigger signal. In addition, the plurality of delay cells 202 may output information for generating a DP including a plurality of pulses based on the trigger signal. The trigger signal may be considered to generate a pulse of a DP, and the plurality of delay pulses and the plurality of pulses of the DP may be considered to be generated by delaying the pulse of the DP generated by the trigger signal based on the information output by the plurality of delay cells 202.

The plurality of delay cells 202 may each output information for generating a respective one of the plurality of delay pulses based on the trigger signal. In addition, the plurality of delay cells 202 may each output information for generating a respective one of the plurality of pulses of the DP based on the trigger signal.

For example, when five delay pulses and a DP including five pulses are to be generated, the plurality of delay cells 202 may include five delay cells. Therefore, a delay cell 0 206 may output information ($\Phi_{A0}, \Phi_{A1}$) for generating a delay pulse 0 and information ($\Phi_{B0}, \Phi_{B1}$) for generating a pulse 0 of the DP. Similarly, a delay cell 1 to a delay cell 4 may respectively output information ($\Phi_{A2}, \Phi_{A3}$), ($\Phi_{A4}, \Phi_{A5}$), ($\Phi_{A6}, \Phi_{A7}$), ($\Phi_{A8}, \Phi_{A9}$) for respectively generating a delay pulse 1 to a delay pulse 4, and respectively output information ($\Phi_{B2}, \Phi_{B3}$), ($\Phi_{B4}, \Phi_{B5}$), ($\Phi_{B6}, \Phi_{B7}$), ($\Phi_{B8}, \Phi_{B9}$) for respectively generating a pulse 1 to a pulse 4 of the DP.

Next, the plurality of AND gates 201 generate the plurality of delay pulses based on the information for generating the delay pulses input from the plurality of delay cells 202.

For example, when five delay pulses are to be generated, the plurality of AND gates 201 may include five AND gates. An AND gate 0 207 may generate a delay pulse 0 EN<0> by performing an AND operation on the information ($\Phi_{A0}, \Phi_{A1}$) input from the delay cell 0 206. Similarly, an AND gate 1 to an AND gate 4 may respectively generate a delay pulse 1 to a delay pulse 4 EN<1>, EN<2>, EN<3>, and EN<4> by respectively performing an AND operation on the information ($\Phi_{A2}, \Phi_{A3}$), ($\Phi_{A4}, \Phi_{A5}$), ($\Phi_{A6}, \Phi_{A7}$), ($\Phi_{A8}, \Phi_{A9}$) respectively input from the delay cell 1 to the delay cell 4.

The plurality of NOR gates 203 generate the DP based on the information for generating the DP input from the plurality of delay cells 202.

For example, when a DP including five pulses is to be generated, the plurality of NOR gates 203 may include five NOR gates. Therefore, a NOR gate 0 208 may generate a pulse 0 $P_0$ of the DP by performing a NOR operation on the information ($\Phi_{B0}, \Phi_{B1}$) for generating the pulse 0 input from the delay cell 0 206. Similarly, a NOR gate 1 to a NOR gate 4 may respectively generate a pulse 1 to a pulse 4 $P_1$, $P_2$, $P_3$, and $P_4$ of the DP by respectively performing a NOR operation on the information ($\Phi_{B2}, \Phi_{B3}$), ($\Phi_{B4}, \Phi_{B5}$), ($\Phi_{B6}, \Phi_{B7}$), ($\Phi_{B8}, \Phi_{B9}$) respectively input from the delay cell 1 to the delay cell 4.

The pulse combiner 204 generates a DP 205 based on the pulse 0 to the pulse 4 generated by the plurality of NOR gates 203. For example, the pulse combiner 204 may generate the DP 205 by combining the pulse 0 to the pulse 4.

In the example of FIG. 2, a delay pulse generator generates delay pulses corresponding to a plurality of AND gates using the plurality of AND gates, and generates the DP using a plurality of NOR gates. However, this is only an example, and the delay pulse generator may use other logic gates such as OR, NOR, XOR, and NAND gates instead of the AND gates in generating the delay pulses. Also, the delay pulse generator may use other logic gates such as OR, NOR, XOR, and NAND gates instead of the NOR gates in generating the DP.

Figure 3:
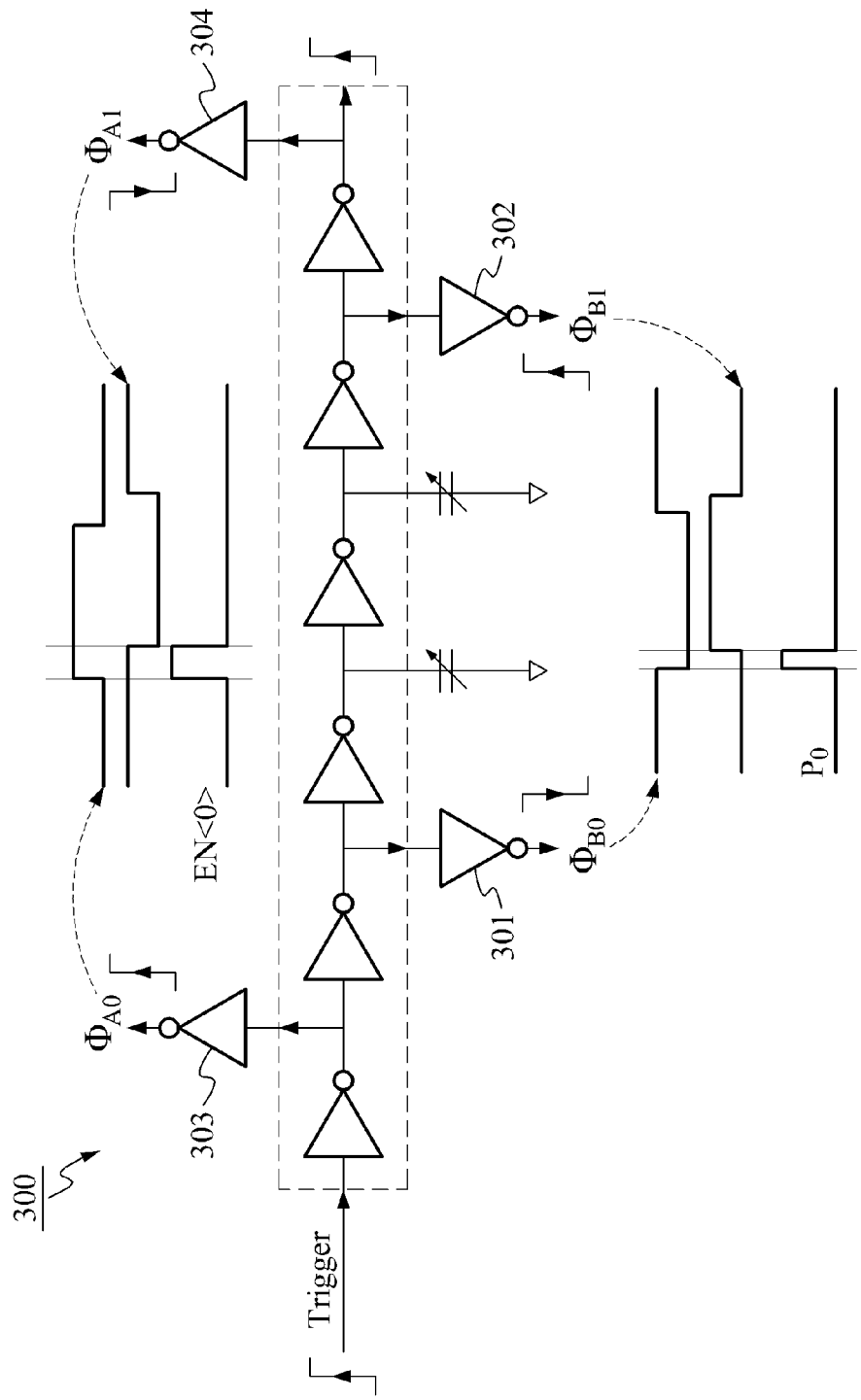
FIG. 3 is a circuit diagram illustrating an example of a delay cell in the delay pulse generator of FIG. 2.

FIG. 3 is a circuit diagram illustrating an example of a delay cell 300 in the delay pulse generator of FIG. 2. Referring to FIG. 3, the delay cell 300 includes a plurality of logic gates. For example, the delay cell 300 may include a plurality of NOT gates as illustrated in FIG. 3.

The delay cell 300 may output information for generating the DP based on a trigger signal using the plurality of NOT gates.

For example, when a DP including five pulses is to be generated and a trigger signal changes from 0 to 1, the delay cell 300 may output information ($\Phi_{B0}=0$, $\Phi_{B1}=0$) for generating a pulse 0 of the DP using a fourth NOT gate 301 and an eighth NOT gate 302 among the plurality of NOT gates. Referring to FIG. 2, the NOR gate 0 208 may output the pulse 0 ($P_0=1$) by performing a NOR operation on the information ($\Phi_{B0}=0$, $\Phi_{B1}=0$) for generating the pulse 0 input from the delay cell 300.

Similarly, the delay cell 300 may output information for generating a pulse 1 to a pulse 4 of the DP based on the trigger signal using the NOT gates. Referring to FIG. 2, corresponding NOR gates may output the pulse 1 $P_1$ by performing a NOR operation on the information for generating the pulse 1 $P_1$, output a pulse 2 $P_2$ by performing a NOR operation on the information for generating the pulse 2 $P_2$, output a pulse 3 $P_3$ by performing a NOR operation on the information for generating the pulse 3 $P_3$, and output a pulse 4 $P_4$ by performing a NOR operation on the information for generating the pulse 4 $P_4$. Accordingly, the pulse combiner 204 may generate the DP by combining the pulse 0 to the pulse 4.

In addition, the delay cell 300 may output the information for generating the delay pulses based the trigger signal using the NOT gates.

For example, when five delay pulses having a duration greater than a duration of the DP are to be generated and the trigger signal changes from 0 to 1, the delay cell 300 may output information ($\Phi_{A0}$=0, $\Phi_{A1}$=0) for generating the delay pulse 0 using a second NOT gate 303 and a tenth NOT gate 304 among the plurality of NOT gates. Referring to FIG. 2, the AND gate 0 207 may output the delay pulse 0 EN<0>=1 by performing an AND operation on the information ($\Phi_{A0}$=0, $\Phi_{A1}$=0) for generating the delay pulse 0.

Similarly, the delay cell 300 may output information for generating the delay pulse 1 to the delay pulse 4 based on the trigger signal using the NOT gates. Referring to FIG. 2, corresponding AND gates may output the delay pulse 1 EN<1> by performing an AND operation on the information for generating the delay pulse 1, output the delay pulse 2 EN<2> by performing an AND operation on the information for generating the delay pulse 2, output the delay pulse 3 EN<3> by performing an AND operation on the information for generating the delay pulse 3, and output the delay pulse 4 EN<4> by performing an AND operation on the information for generating the delay pulse 4.

When a delay pulse 0 having a duration greater than a duration of the pulse 0 $P_0$ of the DP is to be generated based on the duration information input from the information source 102 of FIG. 1, the delay cell 300 may output the information for generating the delay pulse 0 using a number of NOT gates that is greater than a number of NOT gates used to output the information for generating the pulse 0 $P_0$ of the DP. That is, the delay cell 300 may generate a time delay for the delay pulse 0 that is greater than a time delay generated for the pulse 0 $P_0$ of the DP by passing the trigger signal through a greater number of NOT gates for the delay pulse 0 than for the pulse 0 $P_0$ of the DP, thereby controlling the duration of the delay pulse 0 to be greater than the duration of the pulse 0 $P_0$ of the DP. The delay cell 300 may control the number of NOT gates that are used to delay the trigger signal for the delay pulse 0 and the pulse 0 $P_0$ of the DP based on the duration information input from the information source 102 of FIG. 1 using any of a variety of techniques that are well known to one of ordinary skill in the art, and thus will not be described here.

Alternatively, when a delay pulse 0 having a duration less than or equal to a duration of the pulse 0 $P_0$ of the DP is to be generated based on the duration information input from the information source 102, the delay cell 300 may output the information for generating the delay pulse 0 using a number of NOT gates that is less than or equal to a number of NOT gates used to output the information for generating the pulse 0 $P_0$ of the DP. That is, the delay cell 300 may generate a time delay for the delay pulse 0 that is less than or equal to a time delay generated for the pulse 0 $P_0$ of the DP by passing the trigger signal through a fewer number of NOT gates for the delay pulse 0 than for the pulse 0 $P_0$ of the DP or through a same number of NOT gates for the delay pulse 0 as for the pulse 0 $P_0$ of the DP, thereby controlling the duration of the delay pulse 0 to be less than or equal to the duration of the pulse 0 $P_0$ of the DP.

Figure 4:
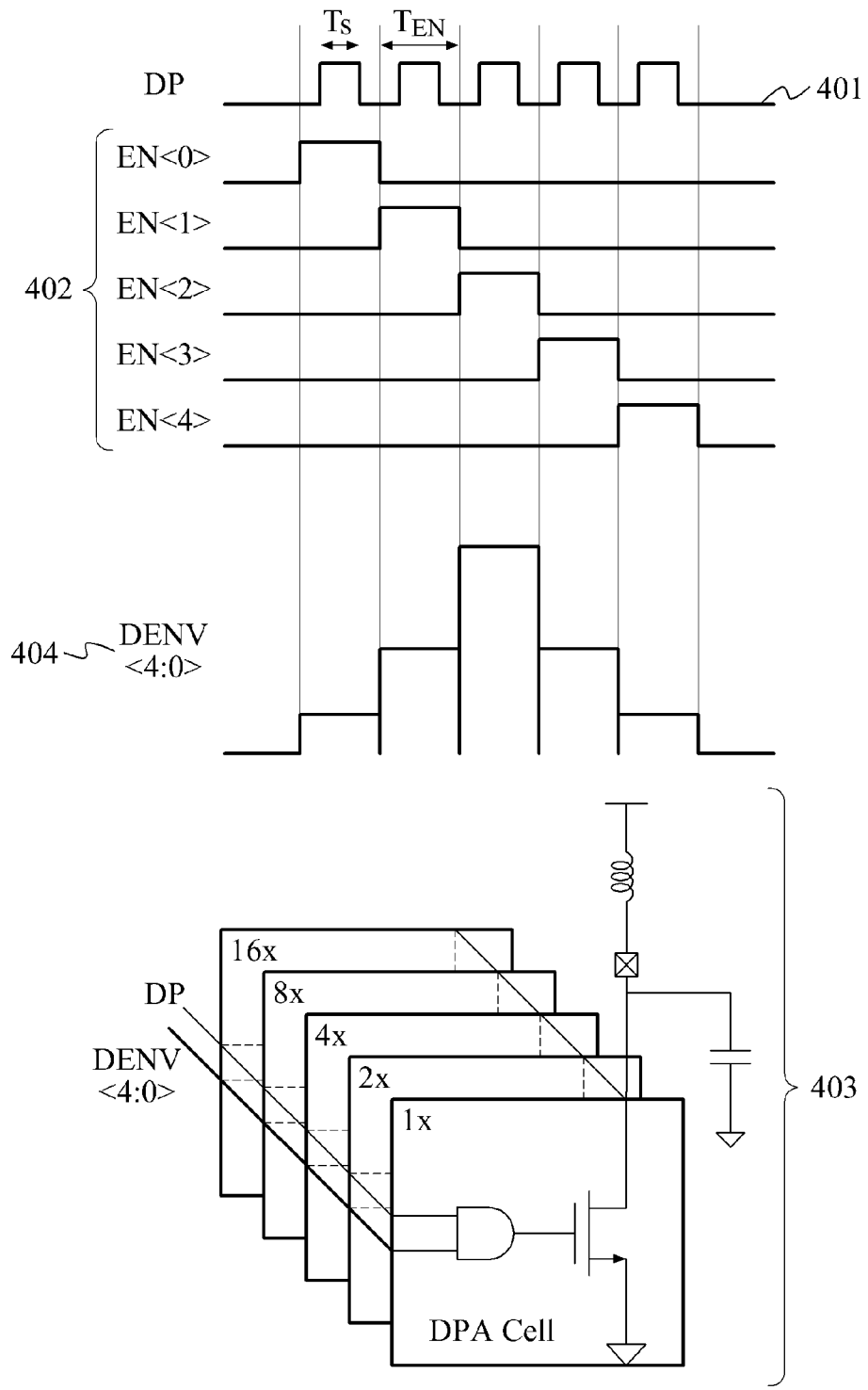
FIG. 4 is a diagram illustrating an example of a DP, a plurality of amplitude modulated delay pulses, and a Gaussian pulse generated by a Gaussian pulse generation apparatus.

FIG. 4 is a diagram illustrating an example of a DP, a plurality of amplitude-modulated delay pulses, and a Gaussian pulse generated by a Gaussian pulse generation apparatus.

Although FIG. 4 illustrates an example in which the delay pulse generator 101 of FIG. 1 generates five delay pulses and a DP having five pulses, this is only an example, and the delay pulse generator 101 may generate more or less than five delay pulses and a DP having more or less than five pulses. The duration $T_{EN}$ of the delay pulses may be fixed in a range between $T_S$ and $2T_S$, or may be varied.

In the example of FIG. 4, the delay pulse generator 110 generates a DP 401 and a plurality of delay pulses 402. The delay pulse generator 101 outputs the DP 401 to the Gaussian pulse generator 104, and outputs the plurality of delay pulses 402 to the amplitude modulator 103. For example, referring to FIG. 4, the delay pulse generator 101 may delay the DP 401 and output the delay pulses 402 controlled to have a duration greater than a duration of the DP 401 to the amplitude modulator 103.

Accordingly, the amplitude modulator 103 of FIG. 1 may modulate amplitudes of the plurality of delay pulses with different degrees of amplification, attenuation, or both amplification and attenuation based on the duration information input from the information source 102 so that the plurality of delay pulses 402 may be combined to obtain a Gaussian pulse shape. For example, the amplitude modulator 103 may amplify the amplitudes of the delay pulse 0 EN<0> and the delay pulse 4 EN<4> by 1 based on the amplitude information and output the amplitude-modulated delay pulses 0 and 4. In addition, the amplitude modulator 103 may amplify amplitudes of the delay pulse 1 EN<1> and the delay pulse 3 EN<3> by 3 based on the amplitude information and output the amplitude-modulated delay pulses 1 and 3. Also, the amplitude modulator 103 may amplify the amplitude of the delay pulse 2 EN<2> by 5 based on the amplitude information and output the amplitude-modulated delay pulse 3.

Therefore, a Gaussian pulse generator 403 may generate a Gaussian pulse by combining the amplitude-modulated delay pulse 0 to the amplitude-modulated delay pulse 4 denoted as DENV<4:0> 404. The Gaussian pulse generator 403 may synchronize the amplitude-modulated delay pulses 0 to 4 with the DP 401, and then combine the amplitude-modulated delay pulses.

For example, the Gaussian pulse generator 403 may generate a Gaussian pulse by combining a plurality of amplitude-modulated delay pulses using a single DPA including five DPA cells, enabling a power consumption, a size, and a manufacturing cost of the Gaussian pulse generation apparatus to be reduced. In the example in FIG. 4, each of the DPA cells includes an AND gate, and the AND gates synchronize the amplitude-modulated delay pulses 0 to 4 with the DP 401. However, the Gaussian pulse generator 403 is not limited to the use of the AND gates to synchronize the amplitude-modulated delay pulses 0 to 4 with the DP 401, and any method known to one of ordinary skill in the art may be used to synchronize the amplitude-modulated delay pulses 0 to 4 with the DP 401.

Figure 5:
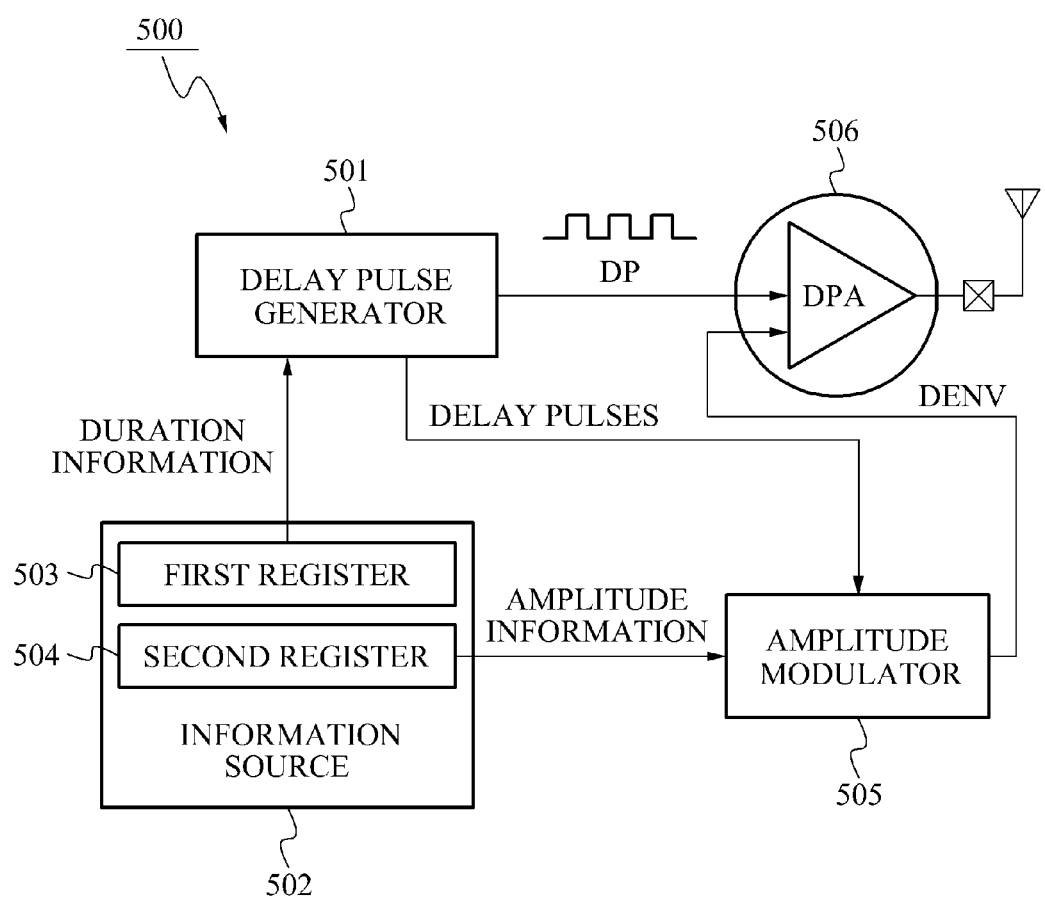
FIG. 5 is a block diagram illustrating an example of a detailed configuration of an example of an ultra wideband (UWB) communication apparatus.

FIG. 5 is a block diagram illustrating a detailed configuration of an example of an ultra wideband (UWB) communication apparatus 500 that includes the Gaussian pulse generation apparatus of FIG. 1. An operation of generating a Gaussian pulse in the UWB communication apparatus of FIG. 5 is substantially the same as the operation of generating a Gaussian pulse in the Gaussian pulse generation apparatus of FIG. 1. Therefore, the description of FIG. 1 is also applicable to FIG. 5, and will not be repeated here.

In the example of FIG. 5, the UWB communication apparatus 500 includes a delay pulse generator 501, an information source 502, an amplitude modulator 505, and a Gaussian pulse generator 506. The information source 502 includes a first register 503 and a second register 504.

The delay pulse generator 501 generates a DP based on a trigger signal using logic gates.

The delay pulse generator 501 generates delay pulses having a controlled duration by delaying the DP.

For example, the delay pulse generator 501 may generate delay pulses having a duration greater than or equal to a duration of the DP by delaying the DP based on duration information.

Thus, by controlling the duration of the delay pulses, the delay pulse generator 501 may control a center frequency.

For example, when it is intended to generate a Gaussian pulse 1 including five delay pulses at a center frequency of about 10 GHz and to generate a Gaussian pulse 2 at a center frequency of about 6 GHz, the delay pulse generator 501 may control a duration of delay pulses included in the Gaussian pulse 1 to be less than a duration of delay pulses included in the Gaussian pulse 2 based on the duration information. That is, the center frequency may be controlled between about 10 GHz and about 6 GHz by controlling the duration of the delay pulses.

That is, the delay pulse generator 501 may control a number of delay pulses so that a number of the delay pulses included in the Gaussian pulse 1 is greater than a number of the delay pulses included in the Gaussian pulse 2, thereby controlling the center frequency between about 10 GHz and about 6 GHz.

The information source 502 stores the duration information used to control the duration of the delay pulses, and amplitude information used to control amplitudes of the delay pulses.

For example, the first register 503 may store the duration information using a frequency control word (FCW) register, and the second register 504 may store the amplitude information using an amplitude control word (ACW) register.

Therefore, the amplitude modulator 505 may modulate amplitudes of a plurality of delay pulses by different degrees of amplification, attenuation, or both amplification and attenuation based on the amplitude information input from the second register 504. The amplitude modulator 505 may modulate the amplitude of the delay pulses in a digital domain so that the amplitude-modulated delay pulses DENV may be combined into a Gaussian pulse shape.

Next, the Gaussian pulse generator 506 generates a Gaussian pulse corresponding to a partial frequency band of a UWB communication frequency band by combining the amplitude-modulated delay pulses DENV. The Gaussian pulse generator 506 may synchronize the plurality of amplitude-modulated delay pulses DENV with the DP input from the delay pulse generator 501, and then combine the plurality of amplitude-modulated delay pulses DENV.

The partial frequency band may include a frequency band defined by an impulse radio-UWB (IR-UWB) spectral mask in the UWB communication frequency band. For example, when a UWB communication frequency band ranging from about 3.1 GHz to about 10.6 GHz defined by a Federal Communications Commission (FCC) spectral mask is used, the Gaussian pulse generator 506 may generate a Gaussian pulse having a bandwidth of about 500 MHz in the UWB communication frequency band.

Accordingly, the UWB communication apparatus may transmit a transmission signal spread over the bandwidth of about 500 MHz in the UWB communication frequency band in a frequency domain without interfering with signals in other frequency bands outside the 500 MHz bandwidth. Thus, the UWB communication apparatus may perform a low-power wireless communication. The transmission signal may include an IR-UWB signal.

As described with FIG. 5, the UWB communication apparatus may control the center frequency by controlling the duration of the delay pulses. Therefore, the UWB communication apparatus may divide an entire UWB communication frequency band ranging from about 3.1 GHz to about 10.6 GHz into a plurality of channels each having a predetermined bandwidth, for example, 500 MHz, and transmit the transmission signal using different center frequencies respectively allocated to the channels.

Accordingly, even when a plurality of users simultaneously transmit transmission signals, the UWB communication apparatus may prevent interference between the users. For example, a user 1 may perform communication using a channel 1, a user 2 may perform communication using a channel 2, and so forth. That is, a user N may perform communication using a channel N.

In this example, the predetermined bandwidth is 500 MHz as defined by the FCC spectral mask. However, the predetermined bandwidth may be lower or higher than 500 MHz.

Figure 6:
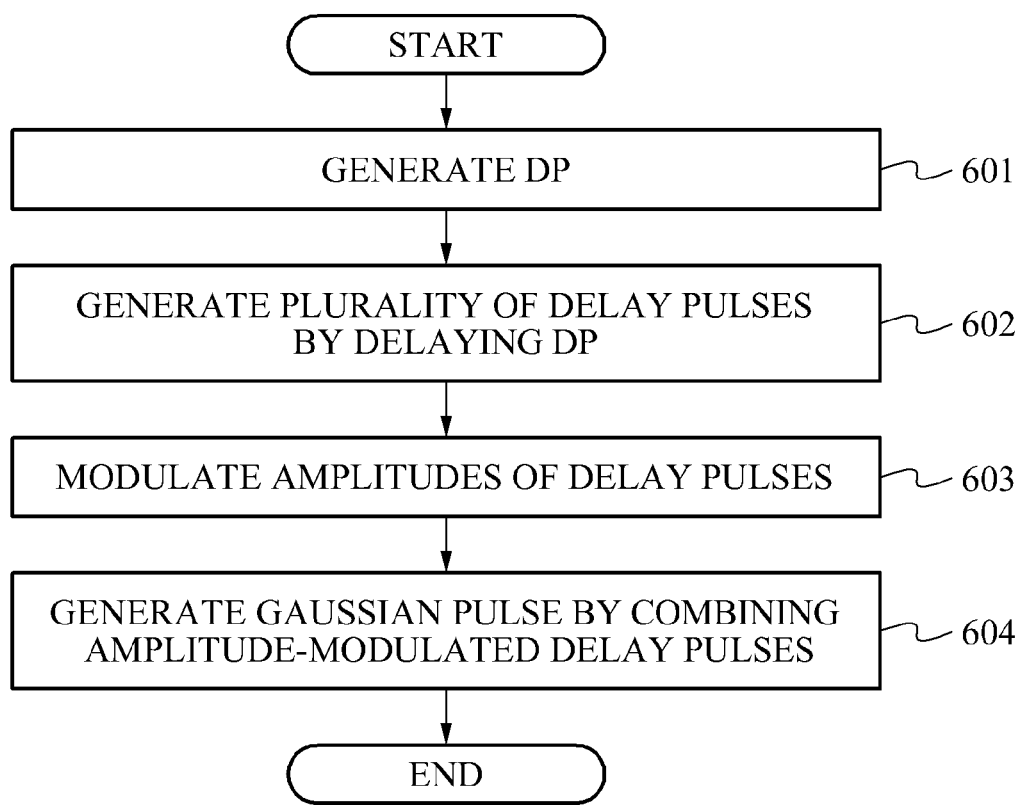
FIG. 6 is a flowchart illustrating an example of a method of generating a Gaussian pulse in the Gaussian pulse generation apparatus of FIG. 1.

FIG. 6 is a flowchart illustrating an example of a method of generating a Gaussian pulse in the Gaussian pulse generation apparatus of FIG. 1. Referring to FIG. 6, in operation 601, the Gaussian pulse generation apparatus generates a DP based on a trigger signal using logic gates.

In operation 602, the Gaussian pulse generation apparatus generates a plurality of delay pulses by delaying the DP.

For example, the Gaussian pulse generation apparatus may generate delay pulses having a duration greater than a duration of the DP by delaying the DP based on duration information. Alternatively, the Gaussian pulse generation apparatus may generate delay pulses having a duration less than or equal to a duration of the DP.

Thus, the Gaussian pulse generation apparatus may control the center frequency by controlling the duration of the plurality of delay pulses. That is, the Gaussian pulse generation apparatus may control the center frequency by controlling a number of the delay pulses included in the Gaussian pulse.

In operation 603, the Gaussian pulse generation apparatus modulates amplitudes of the plurality of delay pulses based on amplitude information.

For example, the Gaussian pulse generation apparatus may modulate amplitudes of the plurality of delay pulses with respectively different degrees of amplification, attenuation, or both amplification and attenuation based on the amplitude information in the digital domain. The Gaussian pulse generation apparatus may modulate the amplitude of the delay pulses with the different degrees of amplification, attenuation, or both amplification and attenuation so that the amplitude-modulated delay pulses may be combined into a Gaussian pulse shape.

For example, when the amplitude information includes respective current amounts of the delay pulses, the Gaussian pulse generation apparatus may modulate the amplitude of the delay pulses in proportion to the current amounts. For example, the Gaussian pulse generation apparatus may modulate the amplitude of the delay pulses with a higher degree of amplification as the current amounts are high, and with a lower degree of amplification as the current amounts are low.

Next, in operation 604, the Gaussian pulse generation apparatus generates a Gaussian pulse by combining the amplitude-modulated delay pulses.

For example, the Gaussian pulse generation apparatus may combine the amplitude-modulated delay pulses using a single DPA. The Gaussian pulse generation apparatus may synchronize the plurality of amplitude-modulated delay pulses with the DP, and then combine the plurality of amplitude-modulated delay pulses.

Figure 7:
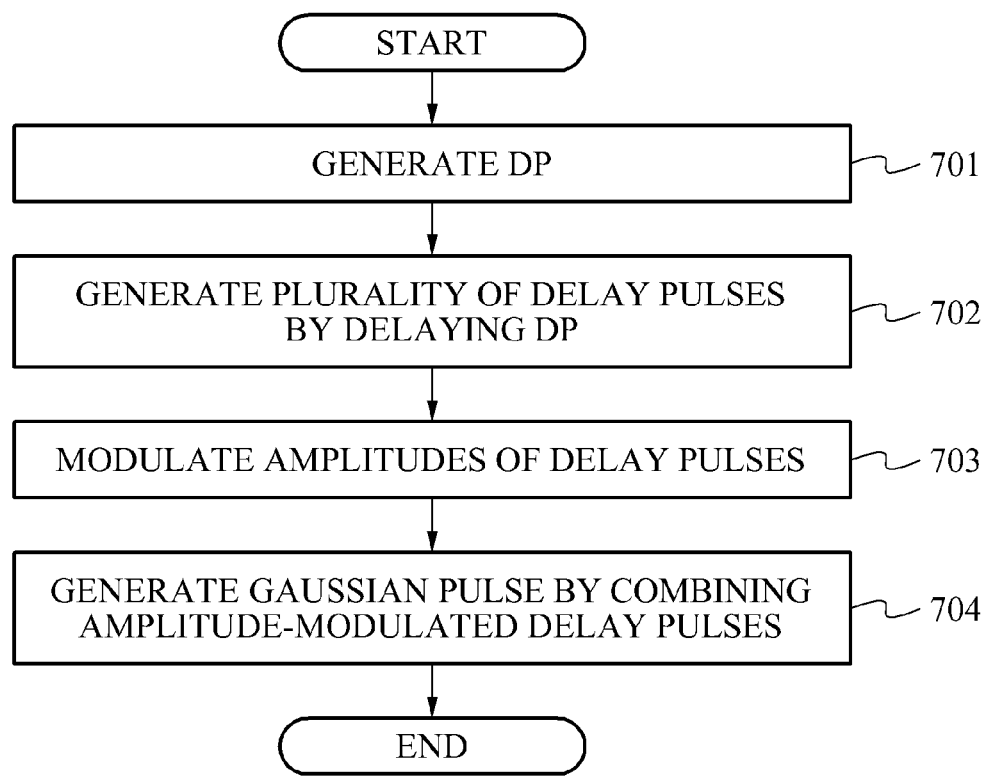
FIG. 7 is a flowchart illustrating an example of a method of generating a Gaussian pulse in the UWB communication apparatus of FIG. 5.

FIG. 7 is a flowchart illustrating an example of a method of generating a Gaussian pulse in the UWB communication apparatus of FIG. 5. Referring to FIG. 7, in operation 701, the UWB communication apparatus generates a DP based on a trigger signal using logic gates.

Next, in operation 702, the UWB communication apparatus generates a plurality of delay pulses by delaying the DP.

For example, the UWB communication apparatus may generate delay pulses having a duration greater than or equal to a duration of the DP by delaying the DP based on duration information.

Thus, by controlling the duration of the delay pulses, the UWB communication apparatus may control a number of the delay pulses included in the Gaussian pulse. Accordingly, the UWB communication apparatus may control a center frequency by controlling the duration or the number of the delay pulses.

For example, when a Gaussian pulse 1 transmitted using a channel 1 having a center frequency of about 10 GHz includes five delay pulses and a Gaussian pulse 2 to be transmitted using a channel 2 having a center frequency of about 6 GHz is to be generated, the UWB communication apparatus may control the number of the delay pulses included in the Gaussian pulse 1 to be greater than the number of the delay pulses included in the Gaussian pulse 2, thereby controlling the center frequency between about 10 GHz and about 6 GHz.

Next, in operation 703, the UWB communication apparatus modulates amplitudes of the plurality of delay pulses based on amplitude information.

Next, in operation 704, the UWB communication apparatus generates a Gaussian pulse by synchronizing amplitude-modulated delay pulses with the DP and then combining the amplitude-modulated delay pulses.

The UWB communication apparatus may generate the Gaussian pulse corresponding to a partial frequency band of the UWB communication frequency band by combining the amplitude-modulated delay pulses. The partial frequency band may include a frequency band defined by the IR-UWB spectral mask in the UWB communication frequency band. For example, when the frequency band defined by the FCC spectral mask is used, the UWB communication apparatus may generate the Gaussian pulse having a bandwidth of about 500 MHz in the UWB communication frequency band.

As described with above reference to FIGS. 6 and 7, the Gaussian pulse generation apparatus and the UWB communication apparatus may control the center frequency by controlling the duration of the delay pulses. Accordingly, the Gaussian pulse generation apparatus and the UWB communication apparatus may divide an entire UWB communication frequency band ranging from about 3.1 GHz to about 10.6 GHz into a plurality of channels each having a predetermined bandwidth, for example, 500 MHz. Therefore, the UWB communication apparatus may provide different channels so that a plurality of users may transmit transmission signals using the different channels without interference. In this example, the predetermined bandwidth is 500 MHz as defined by the FCC spectral mask. However, the predetermined bandwidth may be lower or higher than 500 MHz.

Figure 8:
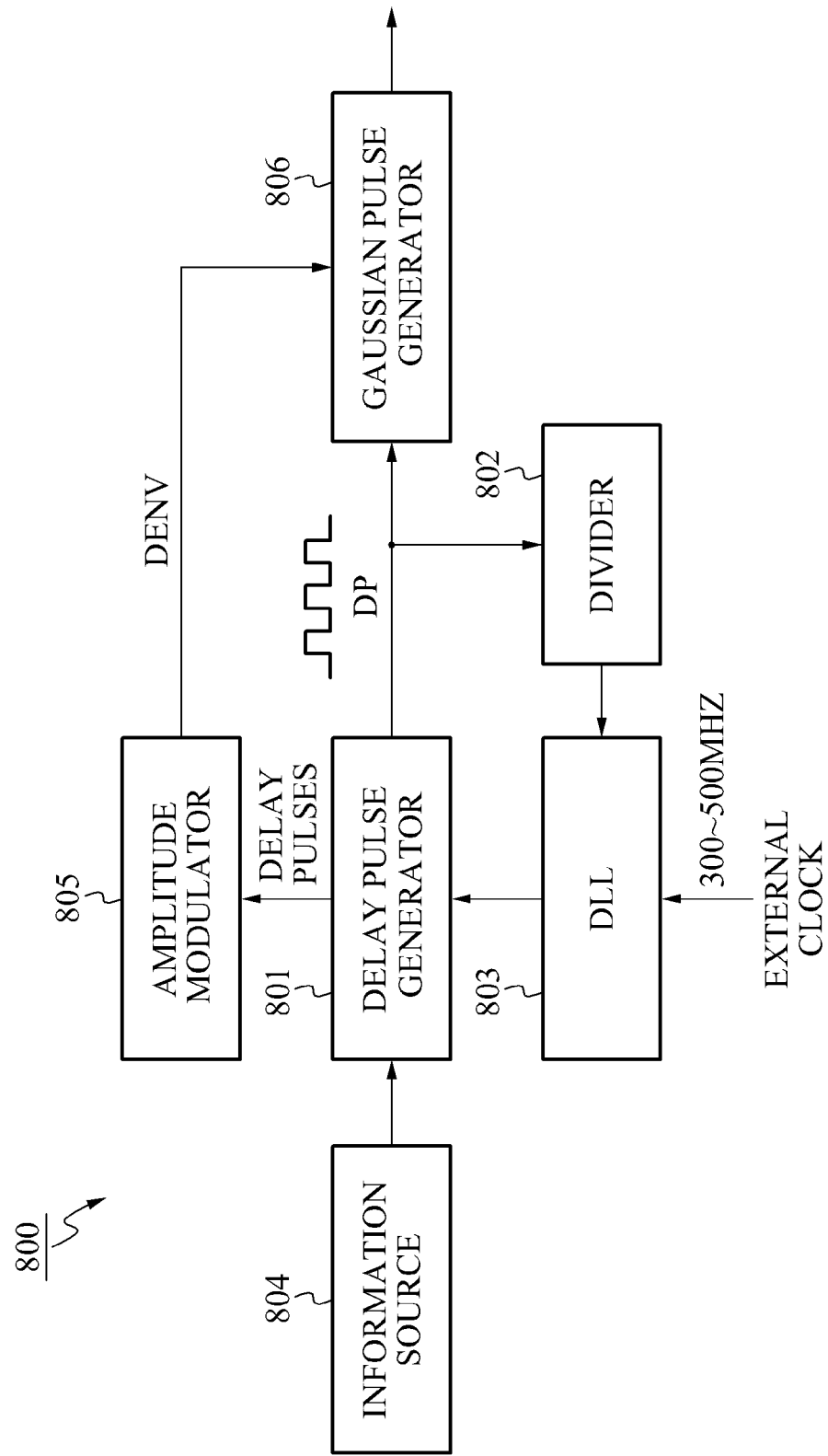
FIG. 8 is a block diagram illustrating an example of a detailed configuration of another example of a Gaussian pulse generation apparatus including a delay-locked loop (DLL).

FIG. 8 is a block diagram illustrating a detailed configuration of another example of a Gaussian pulse generation apparatus 800 including a delay-locked loop (DLL) 803.

In FIG. 8, the Gaussian pulse generation apparatus 800 further includes the DLL 803 and a divider 802 in addition to the Gaussian pulse generation apparatus 100 of FIG. 1. Referring to FIG. 8, the Gaussian pulse generation apparatus 800 includes a delay pulse generator 801, the divider 802, the DLL 803, an information source 804, an amplitude modulator 805, and a Gaussian pulse generator 806. Since the delay pulse generator 801, the information source 804, the amplitude modulator 805, and the Gaussian pulse generator 806 operate in substantially the same manner as the delay pulse generator 101, the information source 102, the amplitude modulator 103, and the Gaussian pulse generator 104 shown in FIG. 1, the description of FIG. 1 is also applicable to FIG. 8, and will not be repeated here.

The divider 802 receives a DP generated by the delay pulse generator 801 and feeds back the DP to the DLL 803. For example, when a center frequency of the DP is about 10 GHz and a target frequency is about 500 MHz, the divider 802 may output a DP having a frequency of about 500 MHz by dividing a frequency of the DP by 20.

The DLL 803 calculates a clock error value of the DP with reference to an external clock. In addition, the DLL 803 outputs error information including the clock error value to the delay pulse generator 801. The external clock may be an accurate reference clock provided by an external device such as a phase-locked loop (PLL) or a crystal. The PLL may provide the accurate external clock using a divider.

For example, the DLL 803 may calculate a clock error value indicating how much the DP is faster or slower than the external clock. In addition, the DLL 803 may output the error information including the clock error value to the delay pulse generator 801.

Therefore, the delay pulse generator 801 may delay the DP more accurately based on the error information. Accordingly, the delay pulse generator 801 may generate delay pulses having a more accurately controlled duration. Consequently, the delay pulse generator 801 may control the center frequency more accurately.

The amplitude modulator 805 modulates amplitudes of the delay pulses based on amplitude information.

The Gaussian pulse generator 806 generates a Gaussian pulse by combining the amplitude-modulated delay pulses DENY.

In the example in FIG. 8, the information source 804 outputs the amplitude information and the duration information only to the delay pulse generator 801. However, this is only an example. The information source 804 may output either one or both of the amplitude information and the duration information to any one or any combination of the delay pulse generator 801, the DLL 803, and the amplitude modulator 805.

Figure 9:
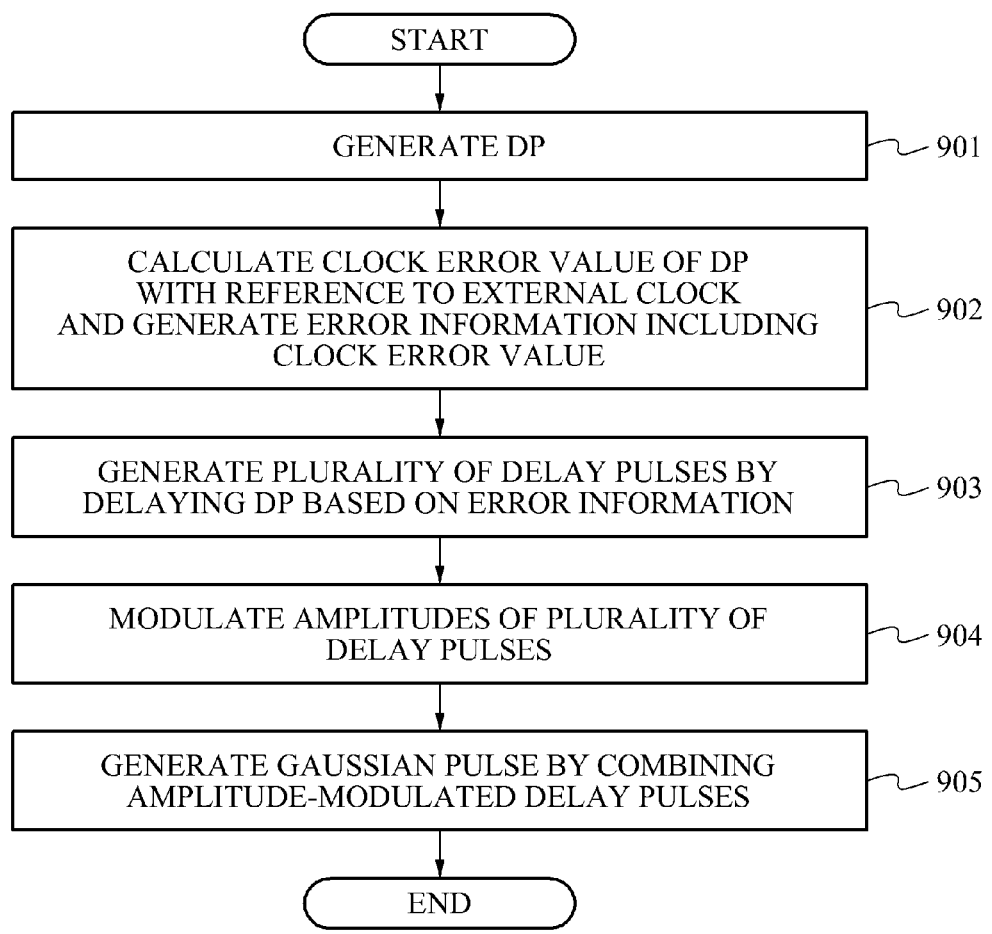
FIG. 9 is a flowchart illustrating an example of a method of generating a Gaussian pulse in the Gaussian pulse generation apparatus of FIG. 8.

FIG. 9 is a flowchart illustrating an example of a method of generating a Gaussian pulse in the Gaussian pulse generation apparatus of FIG. 8. Referring to FIG. 9, in operation 901, the Gaussian pulse generation apparatus generates a DP.

In operation 902, the Gaussian pulse generation apparatus calculates a clock error value of the DP with reference to an external clock. In addition, the Gaussian pulse generation apparatus generates error information including the clock error value.

For example, the Gaussian pulse generation apparatus may calculate a clock error value indicating how much the DP is faster or slower than the external clock, and generate the error information including the clock error value.

The external clock may be an accurate reference clock provided by an external device such as a PLL or a crystal. The PLL may provide the accurate external clock using a divider.

In operation 903, the Gaussian pulse generation apparatus generates a plurality of delay pulses by delaying the DP more accurately based on the error information.

For example, the Gaussian pulse generation apparatus may generate delay pulses having a controlled duration by delaying the DP based on the duration information. The Gaussian pulse generation apparatus may delay the DP by an amount based on the error information. Accordingly, the Gaussian pulse generation apparatus may generate delay pulses having a more accurately controlled duration.

In operation 904, the Gaussian pulse generation apparatus modulates amplitudes of the delay pulses based on the duration information.

The Gaussian pulse generation apparatus may modulate the amplitude of the plurality of delay pulses with different degrees of amplification, attenuation, or both amplification and attenuation based on current amounts of the respective delay pulses.

In operation 905, the Gaussian pulse generation apparatus generates the Gaussian pulse by combining the amplitude-modulated delay pulses.

For example, the Gaussian pulse generation apparatus may combine the amplitude-modulated delay pulses using a single DPA.

Referring to FIGS. 1 to 9, the operation of controlling a delay of a delay pulse using a delay cell and accurately controlling a duration of the delay pulse using a DLL has been described. The delay cell may control the duration of the delay pulse using any one or any combination of at least one variable capacitor, at least one resistor, and at least one inverter or NOT gate. In addition, the delay cell may control the duration of the delay pulse by switching a plurality of capacitors.

The Gaussian pulse generation apparatus 100, the delay pulse generator 101, the information source 102, the amplitude modulator 103, and the Gaussian pulse generator 104 illustrated in FIG. 1; the UWB communication apparatus 500, the delay pulse generator 501, the information source 502, the first register 503, the second register 504, the amplitude modulator 505, and the Gaussian pulse generator 506 illustrated in FIG. 5; and the Gaussian pulse generation apparatus 800, the delay pulse generator 801, the divider 802, the DLL 803, the information source 804, the amplitude modulator 805, and the Gaussian pulse generator 806 illustrated in FIG. 8 that perform the operations illustrated in FIGS. 2-4, 6, 7, and 9 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A pulse generation apparatus comprising:
   a pulse generator configured to generate a plurality of delay pulses;
   an amplitude modulator configured to modulate amplitudes of the plurality of delay pulses; and
   a Gaussian pulse generator configured to generate a Gaussian pulse based on the amplitude-modulated delay pulses, wherein
   the delay pulse generator is further configured to control the center frequency of the Gaussian pulse by controlling the durations of the delay pulses or the number of delay pulses.

2. The pulse generation apparatus of claim 1, wherein the amplitude modulator is further configured to modulate the amplitudes of the plurality of delay pulses with different degrees of amplification, or attenuation, or both amplification and attenuation.

3. The pulse generation apparatus of claim 1, wherein the amplitude modulator is further configured to modulate the amplitudes of the plurality of delay pulses based on current amounts of the plurality of delay pulses in a digital domain.

4. The pulse generation apparatus of claim 1, wherein the Gaussian pulse generator is further configured to combine the amplitude-modulated delay pulses to generate the Gaussian pulse.

5. The pulse generation apparatus of claim 4, wherein the Gaussian pulse generator comprises a single digital power amplifier configured to combine the amplitude-modulated delay pulses to generate the Gaussian pulse.

6. The pulse generation apparatus of claim 1, wherein the delay pulse generator controls the center frequency by controlling the duration of the delay pulses.

7. The pulse generation apparatus of claim 6, wherein the delay pulse generator comprises a delay-locked loop configured to control the center frequency.

8. The pulse generation apparatus of claim 1, wherein the delay pulse generator controls the center frequency by controlling the number of delay pulses.

9. The pulse generation apparatus of claim 1, wherein the Gaussian pulse generator is further configured to generate an impulse radio-UWB (IR-UWB) signal based on the Gaussian pulse.

10. An ultra wideband (UWB) communication apparatus comprising:
    a delay pulse generator configured to generate a plurality of delay pulses;
    an amplitude modulator configured to modulate amplitudes of the plurality of delay pulses; and
    a Gaussian pulse generator configured to generate a Gaussian pulse corresponding to a partial frequency band of a UWB communication frequency band based on the amplitude-modulated delay pulses, wherein
    the delay pulse generator is further configured to control the center frequency of the Gaussian pulse by controlling the durations of the delay pulses or the number of delay pulses.

11. The UWB communication apparatus of claim 10, wherein the Gaussian pulse generator is further configured to combine the amplitude-modulated delay pulses to generate the Gaussian pulse.

12. The UWB communication apparatus of claim 10, wherein the partial frequency band comprises a frequency band defined by an impulse radio-UWB (IR-UWB) spectral mask.

13. The UWB communication apparatus of claim 10, wherein the amplitude modulator is further configured to modulate the amplitudes of the plurality of delay pulses with different degrees of amplification, or attenuation, or both amplification and attenuation.

14. The UWB communication apparatus of claim 10, wherein the delay pulse generator controls the center frequency by controlling the duration of the delay pulses.

15. A pulse generation method comprising:
    generating a plurality of delay pulses;
    modulating amplitudes of the plurality of delay pulses;
    generating a Gaussian pulse based on the amplitude-modulated delay pulses, and
    controlling the center frequency of the Gaussian pulse by controlling the durations of the delay pulses or the number of delay pulses.

16. The pulse generation method of claim 15, wherein the modulating comprises modulating the amplitudes of the plurality of delay pulses with different degrees of amplification, or attenuation, or both amplification and attenuation.

17. The pulse generation method of claim 15, wherein the modulating comprises modulating the amplitudes of the plurality of delay pulses based on current amounts of the plurality of the delay pulses in a digital domain.

18. The pulse generation method of claim 15, wherein the generating of the Gaussian pulse comprises combining the amplitude-modulated delay pulses to generate the Gaussian pulse.

19. The pulse generation method of claim 18, wherein the combining of the amplitude-modulated delay pulses comprises combining the amplitude-modulated delay pulses using a single digital power amplifier to generate the Gaussian pulse.

20. The pulse generation method of claim 15, wherein the center frequency is controlled by controlling the duration of the delay pulses.

21. The pulse generation method of claim 20, wherein the generating of the plurality of delay pulses comprises controlling the center frequency using a delay-locked loop (DLL).

22. The pulse generation method of claim 15, wherein the center frequency is controlled by controlling the number of delay pulses.

23. The pulse generation method of claim 15, wherein the generating of the Gaussian pulse comprises generating an impulse radio-UWB (IR-UWB) signal based on the Gaussian pulse.

24. A pulse generation method comprising:
generating a plurality of amplitude-modulated pulses; and
generating a Gaussian pulse based on the plurality of amplitude-modulated pulses, wherein
the generating of the plurality of amplitude-modulated pulses comprises generating the plurality of amplitude-modulated pulses based on amplitude information providing different degrees of amplification, or attenuation, or both amplification and attenuation for the plurality of amplitude-modulated pulses according to a Gaussian pulse shape.

25. The pulse generation method of claim 24, wherein the generating of the plurality of amplitude-modulated pulses comprises generating the plurality of amplitude-modulated pulses based on duration information for controlling a duration of the plurality of amplitude-modulated pulses.

26. A pulse generation method comprising:
generating a plurality of amplitude-modulated pulses; and
generating a Gaussian pulse based on the plurality of amplitude-modulated pulses, wherein:
the generating of the plurality of amplitude-modulated pulses comprises generating the plurality of amplitude-modulated pulses based on amplitude information providing different degrees of amplification, or attenuation, or both amplification and attenuation for the plurality of amplitude-modulated pulses that will cause a pulse generated by combining the plurality of amplitude-modulated pulses to have a Gaussian pulse shape; and
the generating of the Gaussian pulse comprises combining the plurality of amplitude-modulated pulses having the different degrees of amplification, or attenuation, or both amplification and attenuation to generate the Gaussian pulse.

27. A pulse generation method comprising:
generating a plurality of amplitude-modulated pulses; and
generating a Gaussian pulse based on the plurality of amplitude-modulated pulses, wherein:
the generating of the plurality of amplitude-modulated pulses comprises delaying the plurality of amplitude-modulated pulses relative to one another so that the plurality of amplitude-modulated pulses will adjoin one another without overlapping one another in a pulse generated by combining the plurality of amplitude-modulated pulses; and
the generating of the Gaussian pulse comprises combining the plurality of amplitude-modulated pulses to generate the Gaussian pulse.

28. A pulse generation method comprising:
generating a plurality of amplitude-modulated pulses; and
generating a Gaussian pulse based on the plurality of amplitude-modulated pulses, wherein
the generating of the Gaussian pulse comprises combining the plurality of amplitude-modulated pulses using a single digital power amplifier to generate the Gaussian pulse.

* * * * *